United States Patent
Kurisu

[11] Patent Number: 5,828,256
[45] Date of Patent: Oct. 27, 1998

[54] MULTIPLEXER COMPRISING AN N-STAGE SHIFT REGISTER WITH EACH STAGE COMPOSED OF A DUAL OUTPUT D F/F WITH ONE OUTPUT USED FOR MULTIPLEXING AND THE OTHER FOR NEXT STAGE

[75] Inventor: Masakazu Kurisu, Tokyo, Japan

[73] Assignee: NEC Corporation, Tokyo, Japan

[21] Appl. No.: 791,554

[22] Filed: Jan. 31, 1997

[30] Foreign Application Priority Data

Jan. 31, 1996 [JP] Japan ................................. 8-014853

[51] Int. Cl.$^6$ .................................................. G11C 19/00
[52] U.S. Cl. .......................... 327/161; 327/407; 377/54; 377/75
[58] Field of Search ..................... 327/407, 161, 327/200, 218; 377/54, 75

[56] References Cited

U.S. PATENT DOCUMENTS 5,570,051  10/1996  Chiang et al. ......................... 327/407

OTHER PUBLICATIONS

Robert J. Bayruns et al, "a 3GHz 12–channel Time–Division Multiplexer–Demultiplexer Chip Set", *1986 IEEE International Solid–State Circuits Conference*, Feb. 20, 1986, Session XV No. 15.4.

*Primary Examiner*—Margaret Wambach
*Attorney, Agent, or Firm*—Sughrue, Mion, Zinn, Macpeak & Seas, PLLC

[57] ABSTRACT

For time division multiplexing N bit-parallel circuit input signals at a high bit rate such as higher than 2.4 Gb/s, where N represents a predetermined integer greater than one, a multiplexer circuit comprises an N-stage shift register (11) for shifting a signal pulse through first to N-th dual output D F/F's (11(1)–11(N)) to produce N master and slave output signals as N stage output signals, N two-input NAND gates (15(1)–15(N)) supplied with the N bit parallel circuit input signals and the N master output signals to produce N gate output signals, an N-input NAND gate (17) multiplexing the N gate output signals into a single gate output signal, and a retiming D F/F (19) for retiming the single gate output signal into a bit-serial circuit output signal. The N slave output signals are delivered respectively to the dual output D F/F's of next stages. Each master output signal is produced by a slave input transfer gate (37) in each dual output F/F comprising master and slave latches master-slave connected together. Preferably, the signal pulse is a negative going pulse. NOR gates may be used instead of the NAND gates.

18 Claims, 4 Drawing Sheets

MULTIPLEXER COMPRISING AN N-STAGE SHIFT REGISTER WITH EACH STAGE COMPOSED OF A DUAL OUTPUT D F/F WITH ONE OUTPUT USED FOR MULTIPLEXING AND THE OTHER FOR NEXT STAGE

BACKGROUND OF THE INVENTION

This invention relates to an N:1 time division multiplexer circuit, namely, a multiplexer circuit for time division multiplexing N bit-parallel low speed input signals by using an N-stage shift register into one high speed bit-serial output signal, where N represents an integer which is greater than one.

A 12-bit demultiplexer and a 12-bit multiplexer are reported by Robert J. Bayruns and two others at 1986 IEEE International Solid-State Circuits Conference on Feb. 20, 1986, Session XV as No. 15.4 under the title of "A 3 GHz 12-channel Time-Division Multiplexer-Demultiplexer Chip Set". The multiplexer is clocked, for example, at 3 GHz and is useful in high-speed fiber optic transmission systems.

One of such conventional multiplexer circuits is for time division multiplexing first to N-th bit parallel circuit input signals into a bit-serial circuit output signal and comprises an N-stage shift register for shifting a positive going pulse through first to N-th D flipflops to produce first to N-th stage output signals. Responsive to the first to the N-th bit-parallel circuit input signals supplied to primary first to N-th inputs, respectively, and to the first to the N-th stage output signals supplied to secondary first to N-th inputs, respectively, first to N-th two-input NAND gates produce first to N-th gate output signals, respectively. Supplied with the first to the N-th gate output signals, an N-input NAND gate produces a single gate output signal. Retiming the single gate output signal into the bit-serial circuit output signal, a retiming D flipflop serves as a retiming logic gate.

In the manner which will later become clearer, the shift register is controlled by a shift clock sequence of bit clock pulses. Each of the bit clock pulses builds up and down at a bit clock period. The positive going pulse has most preferably a pulse width equal to that common to the bit clock pulses and is produced as one of the first to the N-th stage output signals at the build up of a pertinent one of the bit clock pulses, namely, at a beginning of one bit clock period. This stage output signal is transmitted through a relevant one of the first to the N-th two-input NAND gates and the N-input NAND gate and enters into the retiming logic gate at the beginning of one of the bit clock periods that follows the above-mentioned one bit clock period. Drawing attention to the N-th D flipflop, a critical path delay time of the conventional multiplexer circuit is substantially equal to one bit clock period at a critical time of operation. It has now been confirmed by the present inventor that such a critical path delay time should be as short as possible in order to make the multiplexer operable at a high speed.

SUMMARY OF THE INVENTION

It is consequently a principal object of the present invention to provide an N:1 time division multiplexer circuit, where N represents a predetermined integer greater than one, which multiplexer circuit comprises an N-stage static shift register for shifting a signal pulse through first to N-th D flipflops to produce first to N-th stage output signals, first to N-th two-input logic gates having primary first to N-th inputs supplied with first to N-th bit-parallel circuit input signals, respectively, and secondary first to N-th inputs supplied with the first to the N-th stage output signals, respectively, to produce first to N-th gate output signals, respectively, an N-input logic gate supplied with the first to the N-th gate output signals to produce a single gate output signal, and a retiming logic gate for retiming the single gate output signal into a bit-serial circuit output signal and is operable at a higher speed than conventional N:1 multiplexer circuits.

It is another principal object of this invention to provide an N:1 time division multiplexer circuit which is of the type described and which has a shortest possible critical path delay time.

It is a subordinate object of this invention to provide an N:1 time division multiplexer circuit which is of the type described and which is simple in structure.

It is another subordinate object of this invention to provide an N:1 time division multiplexer circuit which is of the type described and is satisfactorily operable with a reduced electric power consumption.

Other objects of this invention will become clear as the description proceeds.

In accordance with this invention, there is provided a multiplexer circuit for time division multiplexing first to N-th bit-parallel circuit input signals into a bit-serial circuit output signal, where N represents a predetermined integer greater than one, comprising (a) an N-stage shift register for shifting a signal pulse through first to N-th D flipflops to produce first to N-th stage output signals, (b) first to N-th two-input logic gates having primary and secondary first to N-th inputs supplied with the first to the N-th bit-parallel circuit input signals and with the first to the N-th stage output signals to produce first to N-th gate output signals, respectively, (c) an N-input logic gate supplied with the gate output signals to produce a single gate output signal, and (d) a retiming logic gate for retiming the single gate output signal into the circuit output signal, wherein an n-th D flipflop is an n-th dual output D flipflop producing n-th primary and secondary slave output signals, where n represents an integer variable from 1 to N, the n-th primary slave output signal being used as an n-th one of the first to the N-th stage output signals, the n-th secondary slave output signal being supplied to an (n+1)-th dual output D flipflop provided that (n+1) is not larger than 1.

DESCRIPTION OF THE PREFERRED EMBODIMENTS

Figure 1:
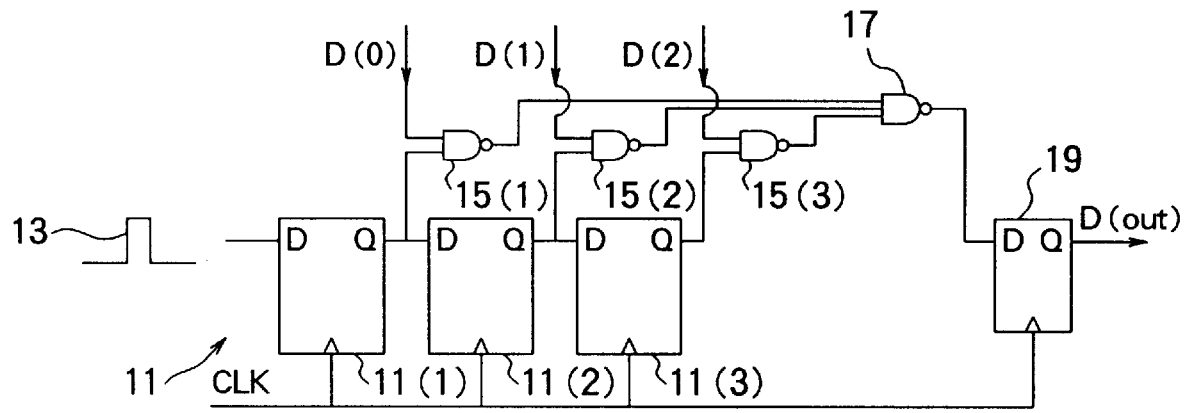
FIG. 1 is a block diagram of a conventional 3:1 time division multiplexer circuit.
Figure 2:
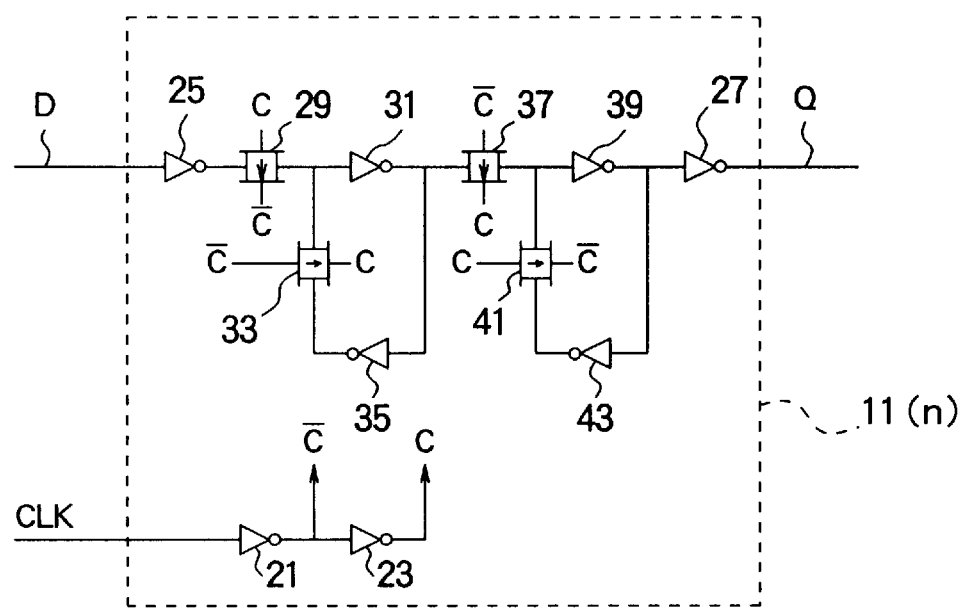
FIG. 2 is a circuit diagram of a D flipflop used in the multiplexer circuit depicted in FIG. 1.

Referring to FIGS. 1 and 2, a conventional 3:1 time division multiplexer circuit will first be described in order to facilitate an understanding of the present invention. In FIG. 1, the multiplexer circuit is for time division multiplexing zeroth to second bit-parallel input signals or parallel input data D(0), D(1), and D(2), three signals in number, into a bit-serial circuit output signal or into serial output data D(out).

The conventional multiplexer circuit comprises a three-stage shift register 11 controlled by a shift or bit clock sequence CLK of bit clock pulses to shift a positive going pulse or high-level pulse 13 through first to third D flipflops 11(1), 11(2), and 11(3) and to produce first to third stage output signals. Preferably, the positive going pulse has a pulse width which is common to the bit clock pulses.

For convenience of the description which follows, such a multiplexer circuit will be referred to as an N:1 time division multiplexer circuit for time division multiplexing first to N-th bit-parallel circuit input signals into a bit-serial circuit output signal, where N represents a predetermined integer which is greater than one. An N-stage shift register produces first to N-th stage output signals. First to N-th stages are composed of first to N-th D flipflops.

In FIG. 1, first to third two-input NAND gates 15(1), 15(2), and 15(3) have primary and secondary first to third inputs. The zeroth to the second parallel input data are supplied to the primary first to third inputs, respectively. The secondary first to third inputs are supplied with the first to the third inputs. The first to the third two-input NAND gates thereby produce first to third gate output signals.

The first to the third gate output signals are supplied in parallel to a three-input NAND gate 17 and are multiplexed into a single gate output signal. Supplied with the single gate output signal, a retiming D flipflop serves as a retiming logic gate 19 for producing the serial output data. Controlled by the bit clock sequence, the retiming logic gate 19 establishes bit synchronism between the serial output data and the bit clock pulses.

In FIG. 2, an n-th D flipflop 11(n) of the first to the N-th D flipflops of the conventional 3:1 time division multiplexer circuit is depicted in greater detail, where n represents an integer which is variable between 1 and N, both inclusive. The n-th D flipflop has a flipflop input terminal D and a flipflop output terminal Q. It should be noted in this connection that the notation D for the terminal has no concern with the reference symbols used to designate the parallel input and the serial output data.

In the n-th D flipflop 11(n) to which a CMOS technology is applied, the shift clock sequence CLK is supplied to a series connection of first and second clock inverters 21 and 23. The first clock inverter 21 produces an inverted clock sequence $\overline{C}$. The second clock inverter 23 produces a non-inverted clock sequence C.

Input and output buffer inverters 25 and 27 are connected to the flipflop input and output terminals D and Q, respectively. The n-th D flipflop 11(n) produces an n-th stage output signal at the flipflop output terminal Q.

Connected to the input buffer inverter 25, a first or master latch comprises a primary first or first master transfer gate 29 connected to the input buffer inverter 25 and controlled by the bit clock sequence CLK, or more in particular, by the non-inverted and the inverted clock sequences. A primary first inverter 31 is connected to the primary first transfer gate 29. A secondary first transfer gate 33 is connected also to the primary first transfer gate 29 and is controlled by the inverted and the non-inverted clock sequences. A secondary first inverter 35 is connected between the secondary first gate 33 and an output side of the primary first inverter 31.

Master-slave connected to the first latch, a second or slave latch comprises a primary second or first slave transfer gate 37 connected to a point of connection between the primary and the secondary first inverters 31 and 35 and controlled by the inverted and the non-inverted clock sequences. A primary second inverter 39 is series connected between the primary second transfer gate 37 and the output buffer inverter 27. A secondary second transfer gate 41 is connected to the primary second transfer gate 37 and is controlled by the non-inverted and the inverted clock sequences. A secondary second inverter 43 is connected between the secondary second transfer gate 41 and a point of series connection of the primary second inverter 39 and the output buffer inverter 27.

Reviewing FIGS. 1 and 2, an N:1 time division multiplexer circuit of this type has a critical path which comprises the first to the N-th D flipflops 11(1), 11(2), ..., 11(N), the first to the N-th two-input NAND gates 15(1), 15(2), ..., and 15(N), the N-input NAND gate 17, and the retiming D flipflop 19. In the conventional N:1 time division multiplexer circuit, an n-th stage output signal appears at the flipflop output terminal Q as a shifted signal pulse when one of the bit clock pulses builds up. Through the n-th two-input NAND gate 15(n) and the N-input NAND gate 17, this shifted signal pulse is put into the retiming D flipflop 19 at a build up of a next bit clock pulse. A time interval between build ups of one bit clock pulse and the next bit clock pulse defines a critical path delay time. Such a critical path delay time must be a predetermined number of bit clock periods in order for the multiplexer circuit to deal with N sequences of the parallel input data.

It will now be assumed that a conventional 8:1 time division multiplexer circuit is manufactured by a recent 0.15-micrometer CMOS process to be operable with a power source voltage of 2 volts. Using the SPICE simulation known in the art, a critical path delay time of this multiplexer circuit was estimated at about 400 ps. This corresponds to a highest operation speed of 2.5 Gb/s. On the other hand, 2.4 Gb/s is currently used in optical trunk communication systems. The critical path delay time can little leave a margin for this high speed of operation and can not be used in practice in current optical communication systems.

Figure 3:
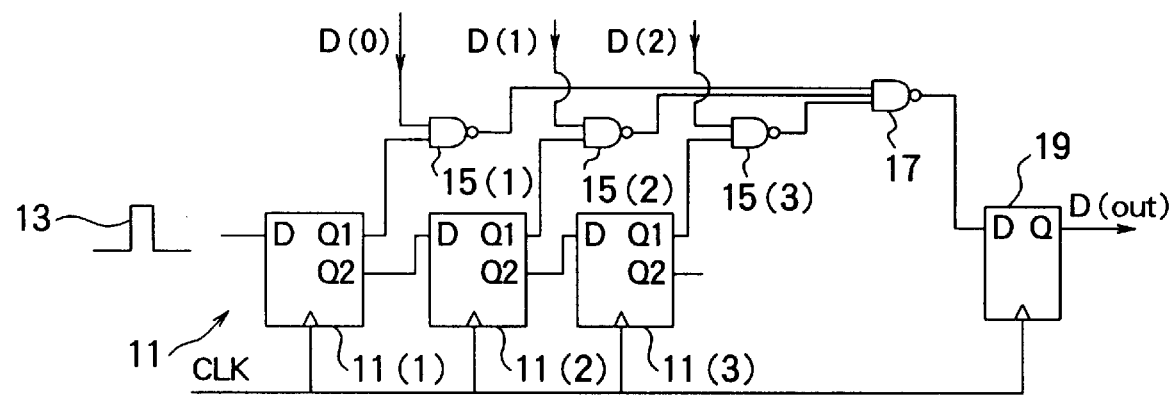
FIG. 3 is a block diagram of a 3:1 time division multiplexer circuit according to a first embodiment of the instant invention.
Figure 4:
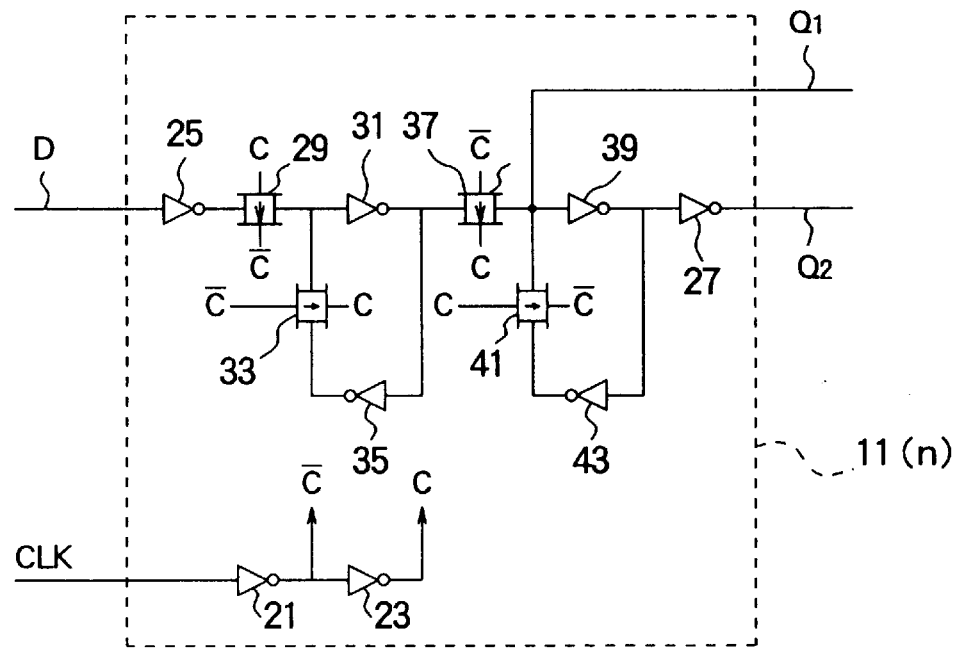
FIG. 4 is a circuit diagram of a dual output D flipflop for use in the multiplexer circuit illustrated in FIG. 3.

Referring now to FIGS. 3 and 4, the description will proceed to an N:1 time division multiplexer circuit according to a first preferred embodiment of this invention. Similar parts are designated throughout the description by like reference numerals and are similarly operable with likewise named signals or pulses unless explicitly otherwise mentioned.

In FIG. 3, a 3:1 time division multiplexer circuit is exemplified, where the predetermined integer N is equal to 3. In contrast to the conventional N:1 time division multiplexer circuit illustrated with reference to FIGS. 1 and 2, the N-stage shift register 11 of this N:1 time division multiplexer circuit comprises first through N-th dual output D flipflops which will again be designated by the reference numeral 11 with suffixes (1), (2), ..., and (N), namely, by 11(1), 11(2), and 11(3). An n-th dual output D flipflop 11(n) is controlled by the shift clock sequence CLK to produce n-th primary and secondary slave output signals Q(1) and Q(2) in response to the positive going pulse 13. The n-th primary slave output signal of the n-th dual output D flipflop 11(n) is delivered to the secondary n-th input of the n-th two-input NAND gate 15(n) as the n-th stage output signal used in FIG. 1. The n-th secondary slave output signal of the n-th dual output flipflop 11(n) is delivered to the flipflop input terminal D of the (n+1)-th dual output D flipflop 11(n+1) provided that (n+1) does not exceed N. Merely for brevity of the description, the primary and the secondary slave output signals will be referred to below as a master and a slave output signal.

In FIG. 4, the n-th dual output D flipflop 11(n) has the flipflop input terminal D and primary and secondary flipflop output terminals Q1 and Q2 for the n-th master and slave output signals and comprises similar parts of the like reference numerals, which parts are similarly connected as in FIG. 2. It should be noted that the primary output terminal Q1 is connected in the slave latch directly to a point of connection of three elements, the primary and the secondary second gates 37 and 41 and the primary second inverter 39. In other words, the "master" output signal Q1 is a signal produced by an input transfer gate 37 of the slave latch. As a consequence, the master output signal Q1 is produced earlier than the slave output signal Q2 by an interval which corresponds to a delay in two inverters of the primary second inverter 39 and the output buffer inverter 27. That is, the critical path of FIG. 3 is supplied with the master output signal Q1 as a "stage" output signal with a reduced delay while the slave output signal is shifted to the dual output D flipflop of a next stage which is not present in the critical path of an n-th one of the first to the N-th bit-parallel circuit input signals.

In the manner discussed in the foregoing, it is possible in FIGS. 3 and 4 to reduce the critical path delay time and to raise the highest operation speed. In fact, the SPICE simulation was applied to a 8:1 time division multiplexer circuit which was manufactured in accordance with FIGS. 3 and 4 by the 0.15-micrometer CMOS process for the 2-volt power source voltage. It was thereby confirmed that the critical path delay time was about 330 ps and was about 70 ps less than the critical path delay time which is described above in connection with the conventional 8:1 time division multiplexer circuit.

Figure 5:
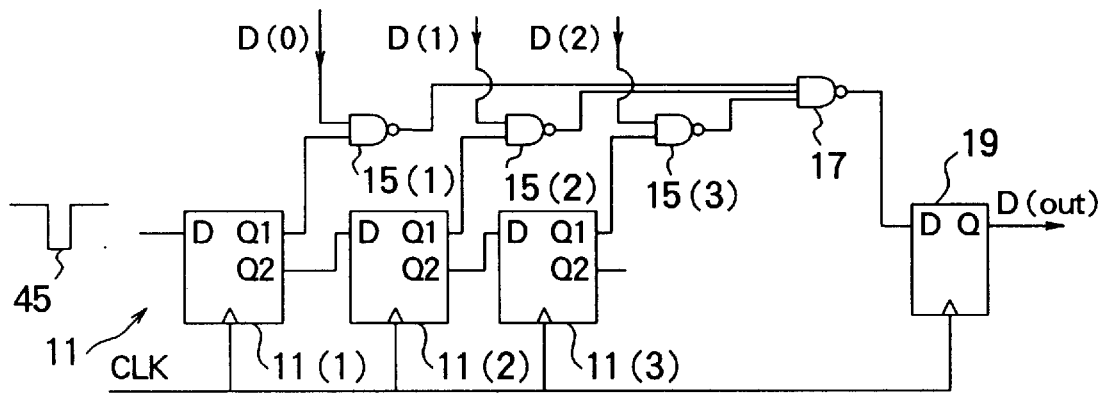
FIG. 5 is a block diagram of a 3:1 time division multiplexer circuit according to a second embodiment of this invention.
Figure 6:
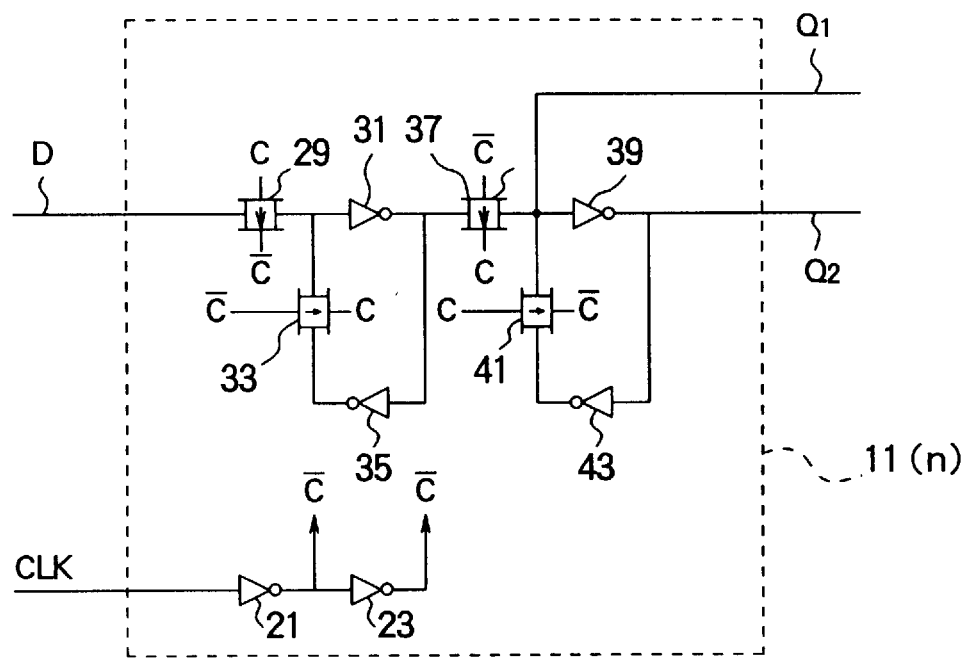
FIG. 6 is a circuit diagram of a dual output D flipflop for use in the multiplexer circuit shown in FIG. 5.

Turning to FIGS. 5 and 6, the description will further proceed to a 3:1 time division multiplexer circuit according to a second preferred embodiment of this invention. This multiplexer circuit is almost similar to that described in conjunction with FIGS. 3 and 4 except for the following.

The N-stage shift register 11 is triggered by a negative going pulse or low-level pulse 45. In correspondence, the n-th dual output D flipflop 11(n) does not comprise the input and the output buffer inverters 25 and 27 described in connection with FIG. 2 or 4. Instead, the flipflop input and the secondary flipflop output terminals D and Q2 are connected in the n-th dual output D flipflop 11(n) directly to the master and the slave latches, respectively, namely, to the primary first transfer gate 29 and to a point of connection between the primary and the secondary second inverters 39 and 43. The primary and the secondary first and second transfer gates 29, 33, 37, and 41 are supplied with the non-inverted and the inverted clock sequences in the manner illustrated in FIG. 2 or 4.

It is readily understood in connection with the example being illustrated that each of the dual output D flipflops 11(1) to 11(N) is similar in structure. It is furthermore possible with this structure to reduce electric power consumption.

Figure 7:
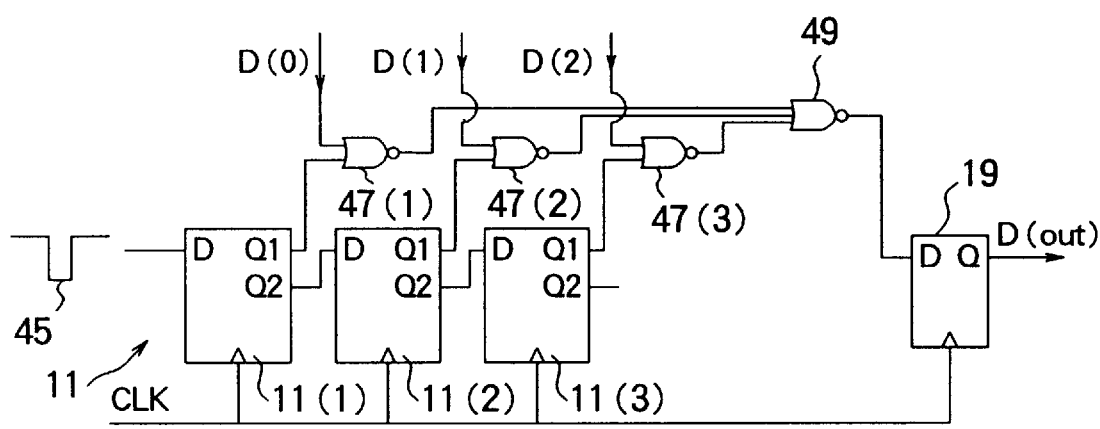
FIG. 7 is a block diagram of a 3:1 time division multiplexer circuit according to a third embodiment of this invention.

Referring afresh to FIG. 7, attention will be directed to a 3:1 time division multiplexer circuit according to a third preferred embodiment of this invention. In place of the first to the N-th two-input NAND gates 15(1) to 15(N) used in FIGS. 1, 3, and 5, use is made of first to N-th two-input NOR gates 47(1), 47(2), . . . , and 47(N). An N-input NOR gate 49 is substituted for the N-input NAND gate 19 used in FIGS. 1, 3, and 5. Under the circumstances, the N-stage shift register 11 is supplied with the negative going pulse 45. The n-th dual output D flipflop 11(n) should accordingly be of the structure described with reference to FIG. 6.

Reviewing FIG. 7, it is possible to use as each of the NOR gates 47 (suffixes omitted) and 49 a high-speed NOR gate, such as a gallium arsenide (GaAs) DCFL circuit. Even when the CMOS process is resorted to, it is possible to use another high-speed NOR gate in which an nMOS circuit is loaded with a pMOS circuit used as a driver. It is therefore possible to raise the speed of operation of the N:1 time division multiplexer circuit illustrated with reference to FIGS. 5 and 6.

While this invention has thus far been described in specific conjunctions with only three preferred embodiments thereof, it will now be readily possible for one skilled in the art to carry this invention into practice in various other manners. For example, it is possible to supply the slave output signal of the N-th dual output D flipflop 11(N) to the flipflop input terminal of the first dual output D flipflop 11(1) as a first flipflop input signal. It is therefore possible to only once apply either the low or the high level pulse to the N-stage shift register 11 as an isolated signal pulse on putting the multiplexer circuit into operation as by a starting one of the shift or bit clock pulses. In this event, the isolated signal pulse is cyclically shifted through the first to the N-th dual output D flipflops 11(1) to 11(N). Although called the first through the N-th bit-parallel input signals, it is unnecessary that corresponding bits of the first through the N-th input data should be exactly concurrent. Instead, the multiplexer circuit produces the serial output data in bit synchronism with the bit clock pulses of the shift clock sequence provided that the corresponding bits are aligned in each bit clock period.

What is claimed is:

1. A multiplexer circuit for time division multiplexing first to N-th bit parallel circuit input signals into a bit-serial circuit output signal, where N represents a predetermined integer greater than one, comprising an N-stage shift register for shifting a signal pulse through first to N-th D flipflops to produce first to N-th stage output signals, first to N-th two-input logic gates having primary and secondary first to N-th inputs supplied with said first to said N-th bit-parallel circuit input signals and with said first to said N-th stage output signals to produce first to N-th gate output signals, respectively, an N-input logic gate supplied with said gate output signals to produce a single gate output signal, and a retiming logic gate for retiming said single gate output signal into said circuit output signal, wherein an n-th D flipflop is an n-th dual output D flipflop producing n-th primary and secondary slave output signals, where n represents an integer variable from 1 to N, said n-th primary slave output signal being used as an n-th one of said first to said N-th stage output signals, said n-th secondary slave output signal being supplied to an (n+1)-th dual output D flipflop provided that (n+1) is not greater than N.

2. A multiplexer circuit as claimed in claim 1, wherein each of said first to said N-th two-input logic gates is a two-input NAND gate, said N-input logic gate being an N-input NAND gate.

3. A multiplexer circuit as claimed in claim 2, said first to said N-th dual output D flipflops being operable in response to a bit clock sequence, wherein said retiming logic gate is controlled by said bit clock sequence to produce said circuit output signal in bit synchronism with said bit clock sequence.

4. A multiplexer circuit as claimed in claim 3, wherein said signal pulse is a negative going pulse.

5. A multiplexer circuit as claimed in claim 4, wherein said negative going pulse is supplied to one of said first to said N-th dual output flipflops only once as a trigger pulse upon start of operation of said multiplexer circuit.

6. A multiplexer circuit as claimed in claim 4, wherein said negative going pulse has a pulse width which is substantially common to bit clock pulses of said bit clock sequence.

7. A multiplexer circuit as claimed in claim 5, wherein said n-th dual output D flipflop is supplied with an n-th flipflop input signal to produce an n-th flipflop output signal as said n-th secondary slave output signal and comprises n-th master and slave latches connected together, said n-th master latch including an n-th master input transfer gate responsive to said bit clock sequence for selectively latching said n-th flipflop input signal in said n-th master latch and producing an n-th master latch output signal, said n-th slave latch including an n-th slave input transfer gate responsive to said bit clock sequence for selectively latching said n-th master latch output signal in said n-th slave latch and producing an n-th slave latch output signal as said n-th flipflop output signal, said n-th slave input transfer gate producing said n-th primary slave output signal.

8. A multiplexer circuit as claimed in claim 3, wherein said signal pulse is a positive going pulse.

9. A multiplexer circuit as claimed in claim 8, wherein said positive going pulse has a pulse width which is substantially common to bit clock pulses of said bit clock sequence.

10. A multiplexer circuit as claimed in claim 9, wherein said positive going pulse is supplied to one of said first to said N-th dual output flipflops only once upon start of operation of said multiplexer circuit.

11. A multiplexer circuit as claimed in claim 9, wherein said n-th dual output D flipflop is supplied with an n-th flipflop input signal to produce an n-th flipflop output signal as said n-th secondary slave output signal and comprises n-th master and slave latches connected together, an n-th input buffer inverter responsive to said n-th flipflop input signal for producing an n-th master latch input signal, and an n-th output buffer inverter responsive to an n-th slave latch output signal for producing said n-th flipflop output signal, said n-th master latch including an n-th master input transfer gate responsive to said bit clock sequence for selectively latching said n-th master latch input signal in said n-th master latch and producing an n-th master latch output signal, said n-th slave latch including an n-th slave input transfer gate responsive to said bit clock sequence for selectively latching said n-th master latch output signal in said n-th slave latch and producing said n-th slave latch output signal, said n-th slave input transfer gate producing said n-th primary slave output signal.

12. A multiplexer circuit as claimed in claim 1, wherein each of said first to said N-th two input logic gates is a two-input NOR gate, said N-input logic gate being an N-input NOR gate.

13. A multiplexer circuit as claimed in claim 12, said first to said N-th dual output D flipflops being operable in response to a bit clock sequence, wherein said retiming logic gate is controlled by said bit clock sequence to produce said circuit output signal in bit synchronism with said bit clock sequence.

14. A multiplexer circuit as claimed in claim 13, wherein said signal pulse is a negative going pulse.

15. A multiplexer circuit as claimed in claim 14, wherein said negative going pulse is supplied to one of said first to said N-th dual output flipflops only once upon start of operation of said multiplexer circuit.

16. A multiplexer circuit as claimed in claim 15, wherein said negative going pulse has a pulse width which is substantially common to bit clock pulses of said bit clock sequence.

17. A multiplexer circuit as claimed in claim 16, wherein said n-th dual output D flipflop is supplied with an n-th flipflop input signal to produce an n-th flipflop output signal as said n-th secondary slave output signal and comprises n-th master and slave latches connected together, said n-th master latch including an n-th master input transfer gate responsive to said bit clock sequence for selectively latching said n-th flipflop input signal in said master latch and producing an n-th master latch output signal, said n-th slave latch including an n-th slave input transfer gate responsive to said bit clock sequence selectively for latching said n-th master latch output signal in said n-th slave latch and producing an n-th slave latch output signal as said n-th flipflop output signal, said n-th slave input transfer gate producing said n-th primary slave output signal.

18. A multiplexer circuit as claimed in claim 1, wherein said (n+1)-th dual output D flipflop is said first dual output D flipflop when (n+1) is greater than N, said N-th slave output signal being supplied to said first dual output signal in place of said signal pulse.

\* \* \* \* \*